US010048322B2

(12) United States Patent
Seo

(10) Patent No.: US 10,048,322 B2
(45) Date of Patent: Aug. 14, 2018

(54) METHOD OF MEASURING BATTERY PACK CURRENT AND CORRECTING OFFSETS OF A CURRENT SENSOR

(71) Applicant: Samsung SDI Co., Ltd., Yongin-si, Gyeonggi-do (KR)

(72) Inventor: Youngdong Seo, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 71 days.

(21) Appl. No.: 15/190,043

(22) Filed: Jun. 22, 2016

(65) Prior Publication Data

US 2017/0003353 A1    Jan. 5, 2017

(30) Foreign Application Priority Data

Jul. 2, 2015 (KR) .......................... 10-2015-0094929

(51) Int. Cl.
*G01R 31/36* (2006.01)
*G01R 35/04* (2006.01)

(52) U.S. Cl.
CPC ..... *G01R 31/3651* (2013.01); *G01R 31/3606* (2013.01); *G01R 31/3624* (2013.01); *G01R 35/04* (2013.01)

(58) Field of Classification Search
CPC ............ H02J 7/0068; H02J 2007/0039; H02J 7/0031; H02J 7/007; H02J 7/045;

(Continued)

(56) References Cited

U.S. PATENT DOCUMENTS 8,575,940 B2* 11/2013 Yugou ...................... B60L 3/04
307/10.1
2009/0230766 A1* 9/2009 Miyama ................ H02J 7/1423
307/10.7

(Continued)

FOREIGN PATENT DOCUMENTS

JP    2002-267698    9/2002
JP    2006-304542    11/2006

(Continued)

OTHER PUBLICATIONS

Extended European Search Report dated Dec. 9, 2016 for European Application No. 16177834.5.

*Primary Examiner* — Vinh Nguyen
(74) *Attorney, Agent, or Firm* — Knobbe, Martens, Olson & Bear, LLP

(57) ABSTRACT

A method of measuring current of a battery pack includes a rechargeable battery, a main switch connected in series to the battery, and a pre-charge switch connected in parallel to the main switch. The method includes: turning on the pre-charge switch and turning off the main switch; measuring a voltage between both terminals of the main switch; calculating a pre-charge current flowing through the pre-charge switch by taking into consideration the resistance of a pre-charge resistor connected in series to the pre-charge switch; measuring current of the battery pack using a current sensor; comparing the current measured using the current sensor with the pre-charge current; and correcting an offset of the current sensor based on results of the comparison.

18 Claims, 6 Drawing Sheets

(58) Field of Classification Search
CPC .... H02J 2007/0037; H02J 7/00; H02J 7/0011; H02J 7/0016; H02J 7/0063; H02J 7/0091; H02J 9/005; H02J 7/0024; H02J 7/0065; H02J 7/02; H02J 7/16; G01R 31/3606; G01R 31/3662; G01R 31/3648; G01R 31/3658; G01R 31/3679; G01R 31/3631; G01R 31/3693; G01R 31/3624; G01R 31/40; G01R 19/0092; G01R 19/16542; G01R 31/007; H01M 8/04873; H01M 10/465; H01M 16/006; H01M 2010/4271; H01M 8/04582; H01H 47/002; H02H 7/18; H02H 9/025

See application file for complete search history.

(56) References Cited

U.S. PATENT DOCUMENTS

| | | |
|---|---|---|
| 2010/0295492 A1 | 11/2010 | Chakrabarti et al. |
| 2011/0037476 A1 | 2/2011 | Jung et al. |
| 2014/0306666 A1 | 10/2014 | Choi et al. |
| 2016/0252584 A1* | 9/2016 | Iwanaga ............ G01R 31/3658 324/434 |
| 2017/0184678 A1* | 6/2017 | Sekiguchi .......... G01R 31/3627 |

FOREIGN PATENT DOCUMENTS

| | | |
|---|---|---|
| KR | 2007-0029936 A | 3/2007 |
| KR | 2010-0113247 A | 4/2009 |
| KR | 2014-0061637 A | 5/2014 |
| KR | 2014-0070148 | 6/2014 |
| WO | WO 2014/077522 A | 5/2014 |

\* cited by examiner

METHOD OF MEASURING BATTERY PACK CURRENT AND CORRECTING OFFSETS OF A CURRENT SENSOR

RELATED APPLICATIONS

This application claims the benefit of Korean Patent Application No. 10-2015-0094929, filed on Jul. 2, 2015, in the Korean Intellectual Property Office, the disclosure of which is incorporated herein in its entirety by reference.

BACKGROUND

Field

One or more exemplary embodiments relate to a method of measuring battery pack current, and more particularly, to a method of accurately measuring current of a battery pack by calculating an offset of a current sensor and reflecting the offset in a current value of the battery pack measured using the current sensor.

Description of the Related Art

Since rechargeable batteries are easily applicable to various products and have good electric characteristics such as high energy density, rechargeable batteries are widely used in various devices requiring electric driving units, such as electric vehicles (EVs) or hybrid vehicles (HVs), as well as in portable devices.

The use of rechargeable batteries can markedly reduce the consumption of fossil fuels without producing by-products, and thus rechargeable batteries receive much attention as the next generation of eco-friendly and highly-efficient energy sources.

Unlike gasoline engine systems, rechargeable battery systems cannot measure absolute physical values providing information such as available electricity and thus use various methods to estimate or predict information such as the state of charge (SOC) of rechargeable batteries using electric characteristic values or variables (e.g., voltage, current, accumulated current, and temperature).

Such estimation methods may be variously classified. For example, there are estimation methods based on parameters such as voltage or open circuit voltage (OCV) and estimation methods based on parameters such as current or accumulated current.

When estimating the state of a rechargeable battery based on the current of the rechargeable battery, accurate measurement of current may be the most important prerequisite. In general, current sensors have been used to measure current values of rechargeable batteries, and FIG. 1 illustrates offset errors when measuring current using a current sensor.

FIG. 1 illustrates current values measured using a current sensor when a current ranging from −10 A to −16 A is periodically applied to the current sensor and a current ranging from 10 A to 13 A is periodically applied to the current sensor.

Referring to FIG. 1, when no current is applied to the current sensor in a period between applications of current to the current sensor, a current value measured by the current sensor is not 0 A. This measurement error is caused by an offset of the current sensor and is proportional to the previous current value measured using the current sensor. Therefore, current values may be measured more accurately if offsets of current sensors are corrected.

SUMMARY OF CERTAIN INVENTIVE ASPECTS

One or more exemplary embodiments include a method of measuring current of a battery pack using a current sensor with a low measurement error by correcting the offset of the current sensor.

Additional aspects will be set forth in part in the description which follows and, in part, will be apparent from the description, or may be learned by practice of the presented embodiments.

According to one or more exemplary embodiments, there is provided a method of measuring current of a battery pack including a rechargeable battery, a main switch connected in series to the battery, and a pre-charge switch connected in parallel to the main switch, the method including: turning on the pre-charge switch and turning off the main switch; measuring a voltage between both terminals of the main switch; calculating a pre-charge current flowing through the pre-charge switch by taking into consideration the resistance of a pre-charge resistor connected in series to the pre-charge switch; measuring current of the battery pack using a current sensor; comparing the current measured using the current sensor with the pre-charge current; and correcting an offset of the current sensor based on results of the comparison.

The turning on of the pre-charge switch and turning off of the main switch may be performed when the current measured using the current sensor is equal to or lower than a first critical value for a preset time period.

The first critical value may correspond to a standby current of the battery pack.

In the turning on of the pre-charge switch and turning off of the main switch, the current sensor may periodically measure current.

The correcting of the offset of the current sensor may be performed when a difference between the pre-charge current and the current measured using the current sensor is equal to or greater than a second critical value.

The pre-charge switch may interrupt an overcurrent flowing to or out from the battery pack.

The method may further include turning on the main switch and turning off the pre-charge switch, after the measuring of current of the battery pack is performed.

The current sensor may comprise a Hall sensor, and the current sensor may be connected in series between the battery and the main switch.

The main switch may electrically connect the battery to a charge-discharge terminal of the battery pack.

The main switch may include a first relay, and the pre-charge switch includes a second relay, wherein the first relay may have capacity greater than that of the second relay.

As described above, according to the method of measuring battery pack current of one or more of the above exemplary embodiments, error of measurement is minimized by correcting the offset of the current sensor.

In some embodiments of this implementation, the first path includes a current sensor and a first switch.

In some embodiments of this implementation, the second path includes a resistor and a second switch and wherein the current on the second path is determined by measuring the voltage across the resistor when the second switch is closed and dividing the measured voltage by the resistance.

In some embodiments of this implementation, interrupting the current flowing through the first path is performed when the current measured is equal to or lower than a first critical value for a preset time period.

In some embodiments of this implementation, the first critical value comprises a standby current of the battery pack.

In some embodiments of this implementation, there is calculating a corrected current value by subtracting the offset from the current measuring on the first path.

In some embodiments of this implementation, the corrected current value is calculated when the current on the first path is equal to or greater than a second critical value.

In some embodiments of this implementation, the second path is disabled and the first path is enabled after the magnitude of the current flowing on the second path is determined.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
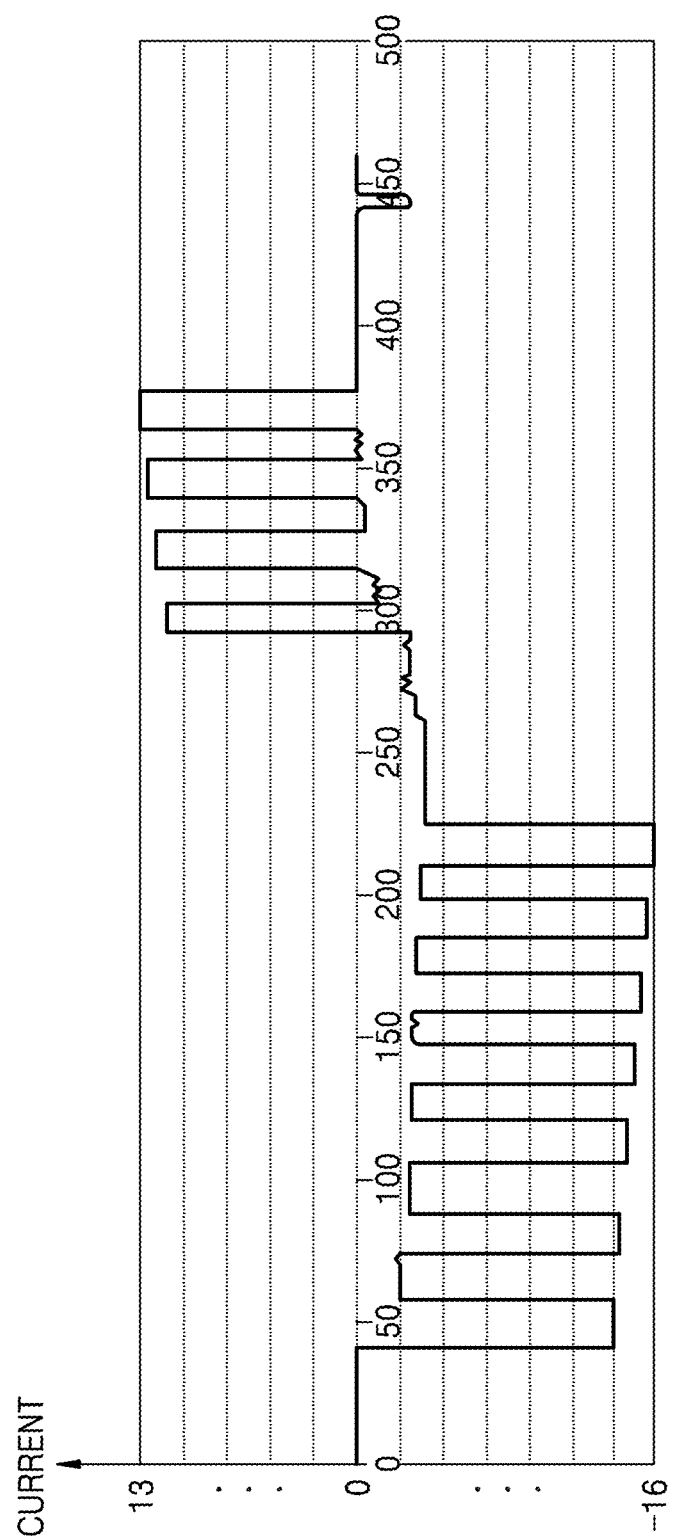
FIG. 1 is a graph illustrating exemplary current measurement errors caused by an offset of a current sensor.

Reference will now be made in detail to exemplary embodiments, examples of which are illustrated in the accompanying drawings. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items.

In the following description, the technical terms are used only for explaining a specific exemplary embodiment while not limiting the inventive concept. The terms of a singular form may include plural forms unless referred to the contrary. The meaning of "include" or "comprise" specifies a property, a fixed number, a step, a process, an element, a component, and a combination thereof but does not exclude other properties, fixed numbers, steps, processes, elements, components, and combinations thereof. It will be understood that although the terms "first" and "second" are used herein to describe various elements, these elements should not be limited by these terms. Terms are only used to distinguish one element from other elements.

Hereinafter, the exemplary embodiments will be described in detail with reference to the accompanying drawings. Like reference numerals denote like elements throughout. In the drawings, like reference numerals denote like or corresponding elements, and repeated descriptions thereof will be omitted.

Figure 2:
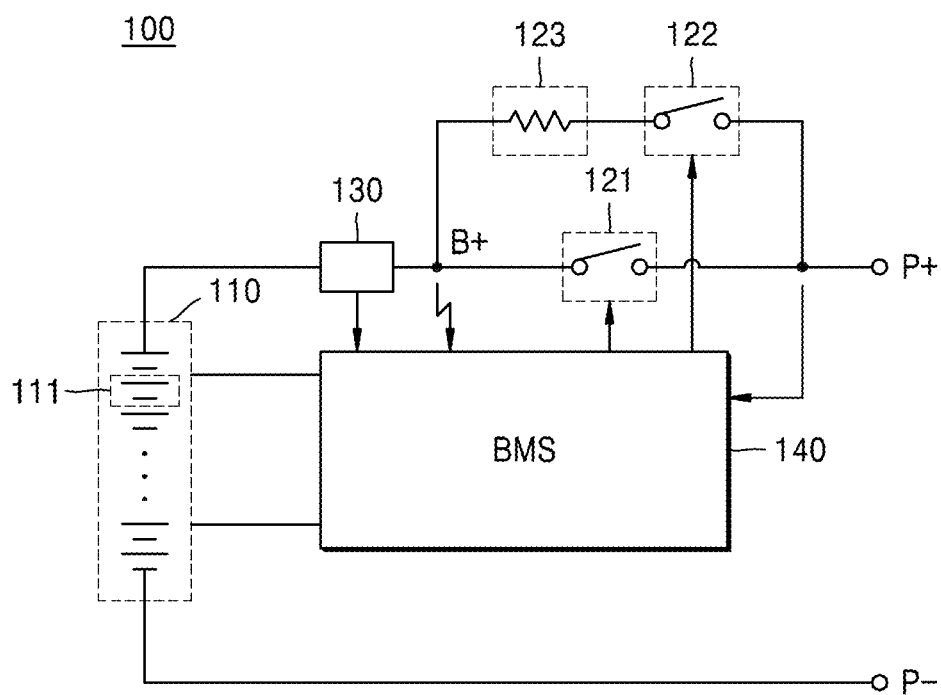
FIG. 2 is a view illustrating an exemplary structure of a battery pack.

FIG. 2 is a view illustrating an exemplary structure of a battery pack 100.

The battery pack 100 illustrated in FIG. 2 is an example for explaining methods of measuring battery pack current, according to exemplary embodiments of the present disclosure. That is, the battery pack current measuring methods of the exemplary embodiments are not limited to using the battery pack 100.

Referring to FIG. 2, the battery pack 100 includes a rechargeable battery 110 (hereinafter, referred to as the battery 110), a main switch 121 connected in series to the battery 110, and a pre-charge switch 122 connected in parallel to the main switch 121. The battery 110 may include one or more rechargeable battery cells 111.

The battery cells 111 may be connected in series, parallel, or series-parallel. The number of battery cells 111 included in the battery 110 may vary depending on a required output voltage.

The battery 110 may be connected to a load or a charger through charge-discharge terminals P+ and P−. In a discharge mode, the battery pack 100 supplies electric energy to the load through the charge-discharge terminals P+ and P−, and in a charge mode, the battery pack 100 stores electric energy received from the charger through the charge-discharge terminals P+ and P−. If the battery pack 100 is connected to a pure electric vehicle configured to operate only using electric energy or an electric vehicle such as a hybrid vehicle configured to operate using electric energy and a fossil fuel, the above-mentioned load may be a driving motor of the electric vehicle, and the above-mentioned charger may be a charger of the electric vehicle or a regenerative generator of the electric vehicle converting kinetic energy into electric energy during braking.

If a power converter connected between the battery pack 100 and one or more of a power generation system, a load, and an electric grid is combined with the battery pack 100 to form an energy storage device, the above-mentioned load may the load and/or the electric grid, and the charger may be the power generation system and/or the electric grid.

The battery cells 111 may include rechargeable battery cells. For example, the battery cells 111 may include nickel-cadmium battery cells, lead battery cells, nickel metal hydride (NMH) battery cells, lithium-ion battery cells, lithium polymer battery cells, or the like.

The main switch 121 is connected in series between a positive terminal of the battery 110 and the charge-discharge terminal P+. The pre-charge switch 122 is connected in parallel to the main switch 121. If the main switch 121 is momentarily turned on, a momentary surge current may be applied to a high-voltage circuit component, and thus the high-voltage circuit component may be damaged or the main switch 121 may be fused. Therefore, the pre-charge switch 122 is connected in series to a pre-charge resistor 123 and is turned on before the main switch 121 is turned on so as to limit a current peak.

For example, the pre-charge switch 122 and the pre-charge resistor 123 are pre-charged with a current output from the battery 110 before the current reaches the main switch 121, thereby preventing an arc discharge that may occur if the current directly reaches the main switch 121. Therefore, the battery pack 100 may have improved circuit stability.

To this end, the pre-charge switch 122 may be connected in parallel to the main switch 121, and the pre-charge resistor 123 may be connected in series to the pre-charge switch 122.

The main switch 121 may include a first relay, and the pre-charge switch 122 may include a second relay. The capacity of the first relay may be greater than the capacity of the second relay.

The main switch 121 is disposed along a path through which discharge current of the battery 110 flows or charge current of an external charger flows to the battery 110.

Therefore, generally, high current flows through the main switch 121. However, a relatively low current flows through the pre-charge switch 122 compared to current flowing through the main switch 121. Therefore, the first relay of the main switch 121 may have a capacity greater than the capacity of the second relay of the pre-charge switch 122.

In addition, the battery pack 100 may include a current sensor 130. The current sensor 130 may be connected in series between the battery 110 and the main switch 121 to measure discharge current output from the battery 110 and/or charge current input to the battery 110. The current sensor 130 may be a Hall sensor.

In addition, the battery pack 100 may further include a battery management system (BMS) 140. The BMS 140 sets a protection level for the battery 110, and if charge current flowing to the battery 110 is equal to or higher than the protection level, the BMS 140 may interrupt the charge current.

The BMS 140 monitors the state of the battery 110 and controls overall operations of the battery 110 such as charge and discharge operations. The BMS 140 may measure parameters of the battery pack 100 such as cell voltage, temperature, charge current, or discharge current, and may control charge and discharge operations of the battery 110 based on measured data. Based on the measured data, the BMS 140 may calculate the remaining electricity, lifespan, or SOC of the battery 110 or may determine whether the battery 110 has errors. For example, the BMS 140 may determine whether the battery 110 has errors such as overcharge, overdischarge, overcurrent, overvoltage, overheating, battery cell imbalance, or battery cell deterioration. If it is determined that the battery 110 has error, the BMS 140 may take action according to an internal algorithm. For example, the BMS 140 may control a charge switch and/or a discharge switch or cut a fuse. In addition, the BMS 140 may control balancing between the battery cells 111 of the battery 110 based on measured data and a preset algorithm.

Current values measured by the current sensor 130 may be transmitted to the BMS 140, and the BMS 140 may control the battery 110 based on the current values received from the current sensor 130

FIGS. 3 to 6 are flowcharts illustrating methods of measuring battery pack current according to exemplary embodiments.

Figure 3:
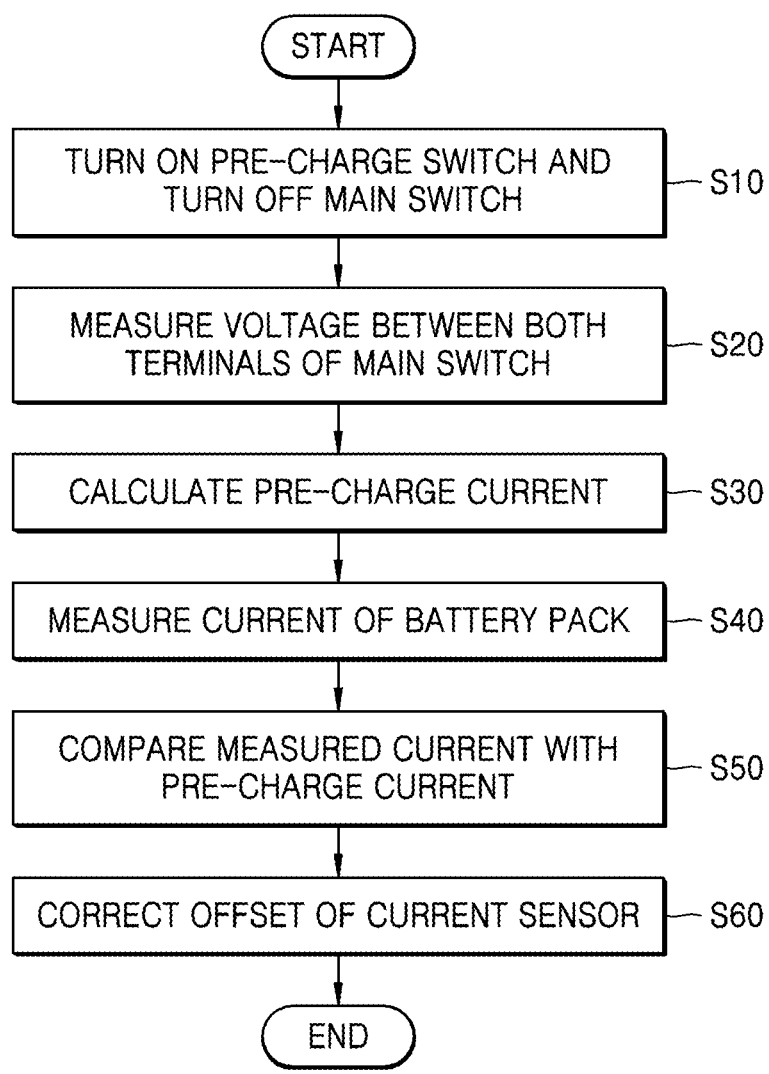
FIGS. 3 to 6 are flowcharts illustrating methods of measuring battery pack current, according to exemplary embodiments.

First, with reference to FIG. 3, a method of measuring battery pack current will be described according to an exemplary embodiment. According to the exemplary embodiment, the method of measuring battery pack current includes: turning on a pre-charge switch and turning off a main switch (operation S10); measuring a voltage between both terminals of the main switch (operation S20); calculating a pre-charge current (operation S30); measuring current of a battery pack (S40); comparing the measured current and the pre-charge current (S50); and correcting an offset of a current sensor (S60).

The method of measuring battery pack current is for a battery pack such as the battery pack 100 described with reference to FIG. 2. The following descriptions of FIGS. 3 to 6 may be clearer by referring to the description provided with reference to FIG. 2. However, as mentioned above, the battery pack 100 illustrated in FIG. 2 is an example. That is, it will be apparent to those of ordinary skill in the art that the methods of measuring battery pack current of the exemplary embodiments may be applied to other battery packs including elements other than those included in the battery pack 100.

In operation S10 of the method of measuring battery pack current of the exemplary embodiment, the pre-charge switch 122 (refer to FIG. 2) may be turned on, and the main switch 121 (refer to FIG. 2) may be turned off. That is, before the method of measuring battery pack current is performed, the pre-charge switch 122 of the battery pack 100 may be in a turned-off state, and the main switch 121 may be in a turned-on state.

If the battery pack 100 is connected to an electric vehicle, and the main switch 121 is turned on, discharge current of the battery pack 100 is applied to a driving motor of the electric vehicle. In this case, the driving motor may be considered as a load receiving electric energy from the battery pack 100. Before the main switch 121 is turned off, the pre-charge switch 122 may be turned on particularly for preventing a sudden interruption of electric energy supply to the load. However, if it is not necessary to continuously supply electric energy to the load, the pre-charge switch 122 may be turned on after the main switch 121 is turned off.

In operation S20, a voltage between both terminals of the main switch 121 is measured. That is, a potential difference between the positive terminal of the battery 110 and the charge-discharge terminal P+ of the battery pack 100 is measured. Referring to FIG. 2, the measurement of a voltage between both terminals of the main switch 121 in operation S20 may be understood as a measurement of a potential difference between a node B+ and a node P+.

The voltage between both terminals of the main switch 121 may be equal to a voltage applied to an overcurrent prevention circuit constituted by the pre-charge switch 122 and the pre-charge resistor 123 (refer to FIG. 2).

In operation S20, the voltage between both terminals of the main switch 121 may be measured by the BMS 140 (refer to FIG. 2), and the BMS 140 may stored the measured voltage in a separate memory.

In the pre-charge current calculating operation S30, a current flowing through the pre-charge switch 122 may be calculated.

The resistance of the pre-charge resistor 123 is given, and the voltage applied to the pre-charge resistor 123 and the pre-charge switch 122 has been measured in operation S20. Therefore, the current flowing through the pre-charge switch 122, that is, a pre-charge current, may be calculated by the relationship between voltage, resistance, and current.

The pre-charge current calculating operation S30 may be performed by the BMS 140, and the BMS 140 may store the calculated pre-charge current in the separate memory.

In operation S40, the current sensor 130 may measure current of the battery pack 100. The current sensor 130 may be connected in series between the battery 110 and the main switch 121, as described with reference to FIG. 2. The current sensor 130 may be a Hall sensor.

The BMS 140 may receive a current value measured using the current sensor 130 and store the measured current value.

In operation S50, the pre-charge current calculated as a current flowing through the pre-charge resistor 123 and the pre-charge switch 122 is compared with the current of the battery pack 100, measured using the current sensor 130.

When the main switch 121 is turned off, the battery 110, the pre-charge resistor 123, and the pre-charge switch 122 are connected in series. Thus, it is predicted that the current of the battery pack 100 measured using the current sensor 130 is equal to the pre-charge current calculated as a current flowing through the pre-charge resistor 123 and the pre-charge switch 122.

However, in general, current measured using a sensor may be different from actual current because of an offset of the sensor. In operation S50, the pre-charge current is compared with the current measured using the current sensor 130 so as to determine whether the current sensor 130 accurately measures current that actually flows.

In operation S60, the offset of the current sensor 130 is corrected based on results of operation S50, in which the pre-charge is compared with the current measured using the current sensor 130. For example, if the current measured using the current sensor 130 is 1.1 A, and the pre-charge is 1.0 A, it is determined in operation S60 that the offset of the current sensor 130 is +0.1 A. Thereafter, when the current of the battery pack 100 is measured using the current sensor 130, a current value lower than the current measured using the current sensor 130 by 0.1 A may be considered as an actual current value of the battery pack 100.

Furthermore, in operation S60, the offset of the current sensor 130 may be determined as +10%, and then when the current of the battery pack 100 is measured, it may be determined that an actual current of the battery pack 100 is 1/1.1 times the current measured using the current sensor 130.

Figure 4:
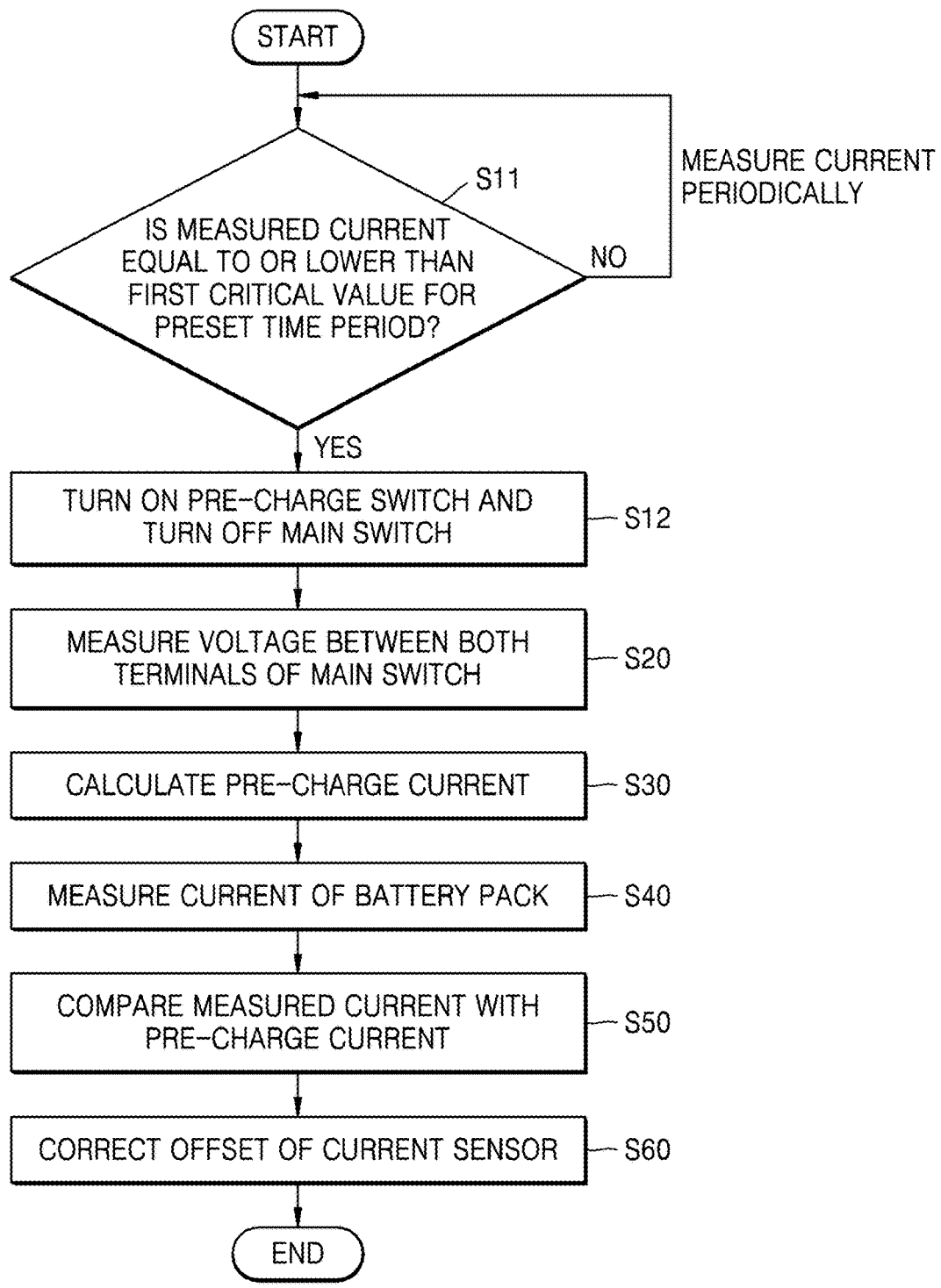

FIG. 4 is a flowchart illustrating a method of measuring battery pack current according to another exemplary embodiment. Referring to the flowchart of FIG. 4, operation S20 of measuring a voltage between both terminals of a main switch to operation S60 of correcting an offset of a current sensor are substantially the same as operation S20 of measuring a voltage between both terminals of a main switch to operation S60 of correcting an offset of a current sensor that are performed in the method of measuring battery pack current described with reference to FIG. 3, and thus repeated descriptions thereof will be omitted.

Referring to FIG. 4, prior to operation S12 of turning on a pre-charge switch and turning off the main switch, the method of measuring battery pack current may further include operation S11 of determining whether a current measured using the current sensor is lower than a first critical value for a preset time period.

In operation S11, if the measured current is lower than the first critical value for the preset time period, operation S12 is performed to turn on the pre-charge switch and turn off the main switch. If not, that is, the measured current is not lower than the first critical value for the preset time period, operation S12 in which the pre-charge switch is turned on and the main switch is turned off is not performed. Instead, current of a battery pack is measured again by using the current sensor. Operation S11 may be periodically performed.

The first critical value may be equal to a standby current of the battery pack. For example, when the battery pack is connected to an electric vehicle, if the main switch is turned off in a general driving mode of the electric vehicle, the main switch may be damaged because a high discharge current is output from the battery pack in the general driving mode. In this case, the discharge current of the battery pack may be output using the pre-charge switch. However, this lowers efficiency because of a voltage drop at a pre-charge resistor.

Therefore, it may be determined whether the main switch can be turned off without problems. For example, if discharge current of the battery pack is low, for example, when the electric vehicle is stationary or moving downhill, the main switch may be turned off without problems.

In operation S11, current of the battery pack may be periodically measured using the current sensor, and it may be determined whether to proceed to the next operation for correcting the offset of the current sensor.

Figure 5:
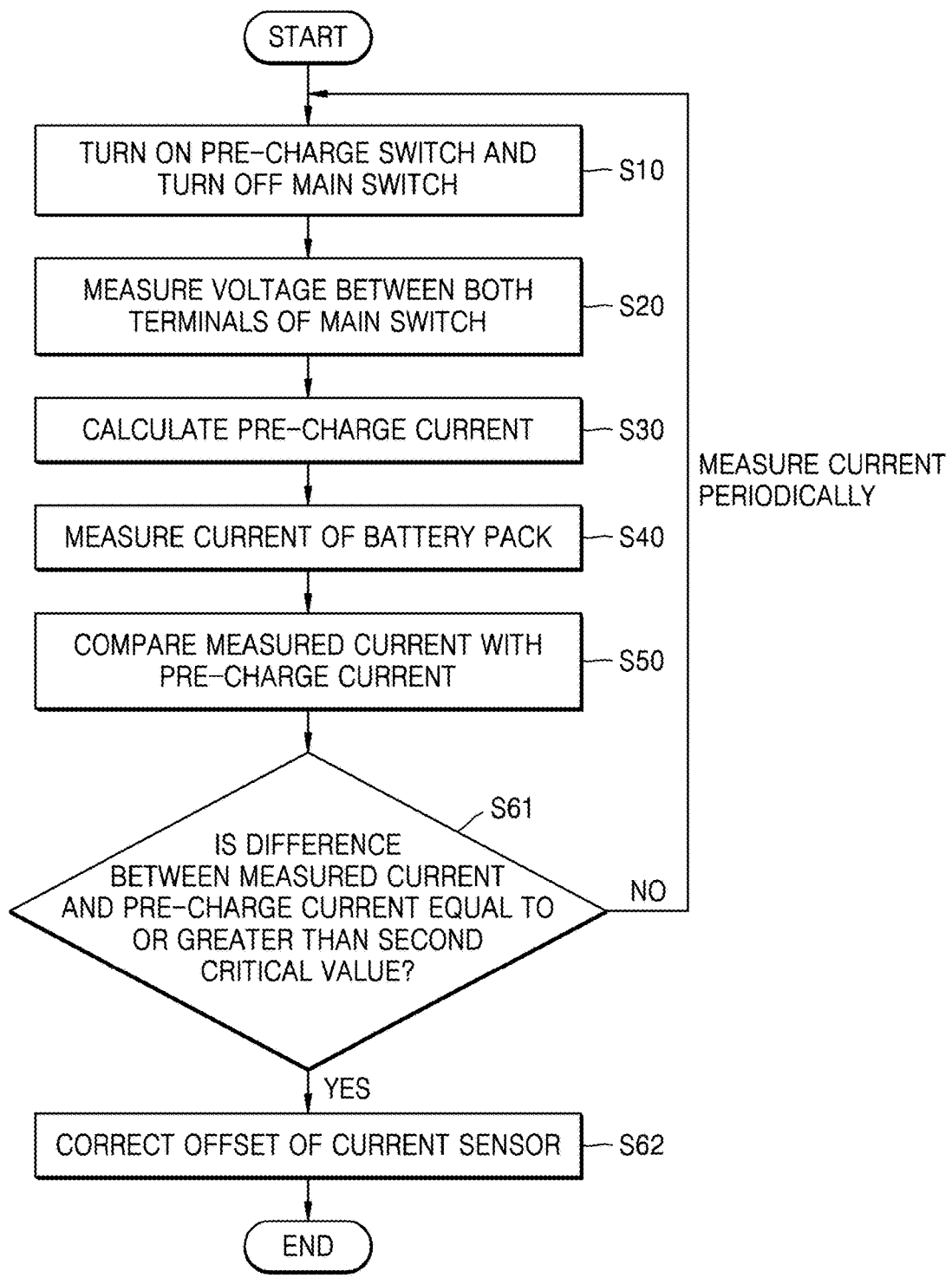

FIG. 5 is a flowchart illustrating a method of measuring battery pack current, according to another exemplary embodiment. Referring to FIG. the flowchart of FIG. 5, operation S10 of turning on a pre-charge switch and turning off a main switch to operation S50 of comparing current values are substantially the same as operation S10 of turning on a pre-charge switch and turning off a main switch to operation S50 of comparing current values performed in the method of measuring battery pack current described with reference to FIG. 3, and thus repeated descriptions thereof will be omitted.

Referring to FIG. 5, prior to operation S62 of correcting an offset of a current sensor, but after operation S50 of comparing a current measured using the current sensor with a pre-charge current, the method of measuring battery pack current may further include operation S61 of determining whether a difference between the measured current and the pre-charge current is equal to or greater than a second critical value.

In operation S61, if the difference between the current of a battery pack measured using the current sensor and the pre-charge current is lower than the second critical value, operation S10 is performed again instead of correcting the offset of the current sensor.

The second critical value may be expressed in percentage (%) or amperes (A) and may vary depending on characteristics of the battery pack or characteristics of a system including the battery pack. In addition, the second critical value may represent an allowable error range or numerical error value of the battery pack.

That is, if the difference between the current of the battery pack measured using the current sensor and the pre-charge current is within an allowable range, the offset of the current sensor is not corrected.

However, if the difference between the current of the battery pack measured using the current sensor and the pre-charge current is equal to or greater than the second critical value, it is determined that the current sensor has a non-allowable error, and thus operation S62 is performed to correct the offset of the current sensor.

Figure 6:
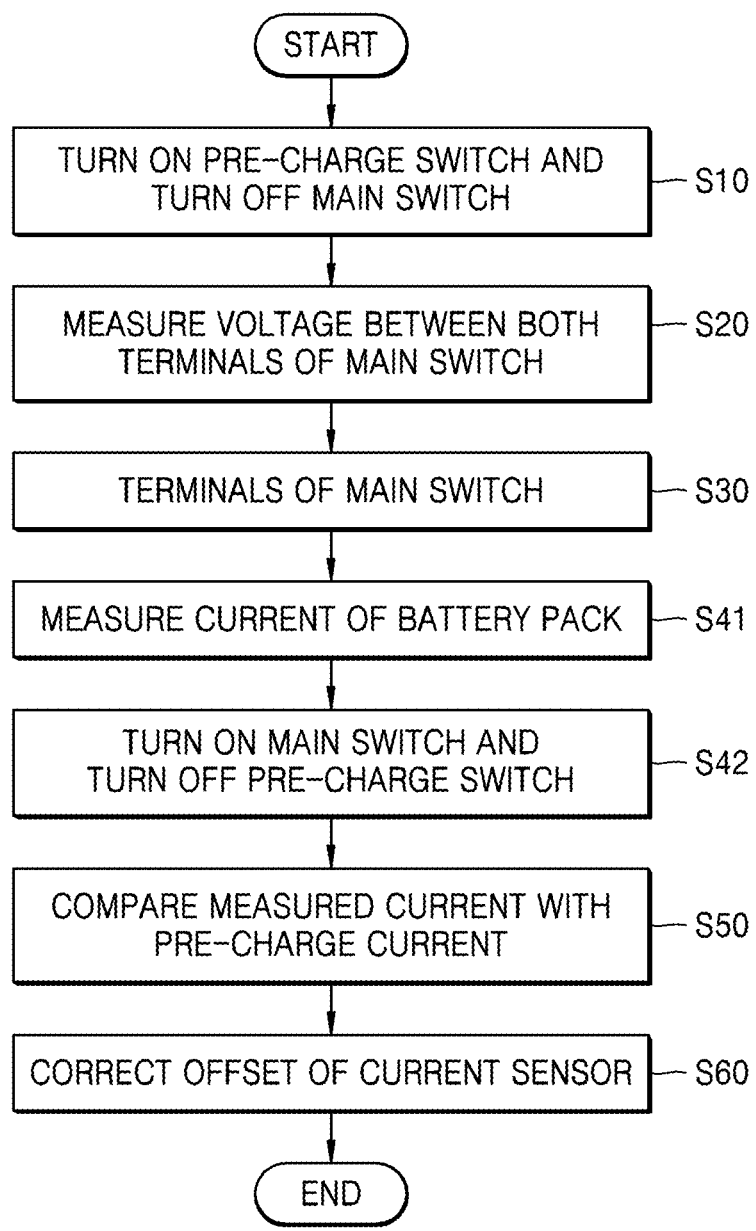

FIG. 6 is a flowchart illustrating a method of measuring battery pack current, according to another exemplary embodiment. Referring to the flowchart of FIG. 6, operations other than operation S42 of turning on a main switch and turning off a pre-charge switch are substantially the same as operations of the method of measuring battery pack current described with reference to FIG. 3, and thus repeated descriptions thereof will be omitted.

Referring to FIG. 6, after operation S41 of measuring current of a battery pack, operation S42 is performed to turn on the main switch and turn off the pre-charge switch.

The pre-charge switch is turned on and the main switch is turned off so as to correct an offset of a current sensor while a relatively low discharge current flows. That is, after operation S30 of calculating a pre-charge current and operation S41 of measuring current of the battery pack using the current sensor, all data necessary for correcting the offset of the current sensor may be obtained.

Therefore, after operation S41 of measuring current of the battery pack, the main switch may be turned on and the pre-charge switch may be turned off so as to prepare for a high discharge current that may output from a battery pack.

Operation S42 of turning on the main switch and turning off the pre-charge switch is performed after current of the battery pack is measured using the current sensor, but is not limited to preceding operation S50 of comparing the measured current with the pre-charge current.

As described with reference to FIGS. 1 to 6, according to the methods of measuring battery pack current of the exemplary embodiments, measurement errors caused by an offset of a current sensor may be corrected, and the current of a battery pack may be measured more accurately.

The flowcharts illustrated in FIGS. 3 to 6 are examples. For example, those of ordinary skill in the art could easily conceive of a battery pack current measuring method including all the operations described with reference to FIGS. 3 to 6.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of measuring current of a battery pack including a rechargeable battery, a main switch connected in series to the battery, and a pre-charge switch connected in parallel to the main switch, the main switch having two terminals, the method comprising:
   turning on the pre-charge switch and turning off the main switch wherein the turning on of the pre-charge switch and turning off of the main switch is performed when the current measured using a current sensor is equal to or lower than a first critical value for a preset time period;
   measuring a voltage between the two terminals of the main switch;
   calculating a pre-charge current flowing through the pre-charge switch by taking into consideration the resistance of a pre-charge resistor connected in series to the pre-charge switch;
   measuring current of the battery pack using the current sensor;
   comparing the current measured using the current sensor with the pre-charge current; and
   correcting an offset of the current sensor based on results of the comparison.

2. The method of claim 1, wherein the first critical value corresponds to a standby current of the battery pack.

3. The method of claim 1, wherein, in the turning on of the pre-charge switch and turning off of the main switch, the current sensor periodically measures current.

4. The method of claim 1, wherein the correcting of the offset of the current sensor is performed when a difference between the pre-charge current and the current measured using the current sensor is equal to or greater than a second critical value.

5. The method of claim 1, wherein the pre-charge switch interrupts an overcurrent flowing to or out from the battery pack.

6. The method of claim 1, further comprises turning on the main switch and turning off the pre-charge switch, after the measuring of current of the battery pack is performed.

7. The method of claim 1, wherein the current sensor comprises a Hall sensor.

8. The method of claim 1, wherein the current sensor is connected in series between the battery and the main switch.

9. The method of claim 1, wherein the main switch electrically connects the battery to a charge-discharge terminal of the battery pack.

10. The method of claim 1, wherein the main switch comprises a first relay, and the pre-charge switch comprises a second relay,
    wherein the first relay has capacity greater than that of the second relay.

11. A method of measuring current of a battery pack including a rechargeable battery connected to a load via a first path, the method comprising:
    measure the current flowing on the first path between the battery and load with a current sensor;
    interrupting current flowing on the first path between the battery and the load;
    enabling current flow along a second path parallel to the first path between the battery and the load, wherein the second path includes a reference load; wherein the interrupting current flowing on the first path and enabling current flow along the second path is performed when the current measured using the current sensor is equal to or lower than a first critical value for a preset time period;
    determining the magnitude of the current flowing on the second path;
    determining an offset of the current as being the difference between the magnitude of the current flowing on the first path and the second path.

12. The method of claim 11, wherein the first path includes a current sensor and a first switch.

13. The method of claim 12, wherein the second path includes a resistor and a second switch and wherein the current on the second path is determined by measuring the voltage across the resistor when the second switch is closed and dividing the measured voltage by the resistance.

14. The method of claim 11, wherein interrupting the current flowing through the first path is performed when the current measured is equal to or lower than a first critical value for a preset time period.

15. The method of claim 14, wherein the first critical value comprises a standby current of the battery pack.

16. The method of claim 11, further comprising calculating a corrected current value by subtracting the offset from the current measuring on the first path.

17. The method of claim 16, wherein the corrected current value is calculated when the current on the first path is equal to or greater than a second critical value.

18. The method of claim 11, wherein the second path is disabled and the first path is enabled after the magnitude of the current flowing on the second path is determined.

* * * * *